United States Patent
Hu et al.

(10) Patent No.: US 12,231,095 B2
(45) Date of Patent: Feb. 18, 2025

(54) PA OUTPUT MATCHING CIRCUIT, RF FRONT-END MODULE AND WIRELESS DEVICE

(71) Applicant: RADROCK (SHENZHEN) TECHNOLOGY CO., LTD., Guangdong (CN)

(72) Inventors: Zijie Hu, Guangdong (CN); Yuan Cao, Guangdong (CN); Nan Ni, Guangdong (CN); Jianxing Ni, Guangdong (CN)

(73) Assignee: RADROCK (SHENZHEN) TECHNOLOGY CO., LTD., Shenzhen (CN)

( * ) Notice: Subject to any disclaimer, the term of this patent is extended or adjusted under 35 U.S.C. 154(b) by 558 days.

(21) Appl. No.: 17/613,945

(22) PCT Filed: Aug. 12, 2020

(86) PCT No.: PCT/CN2020/108586
§ 371 (c)(1),
(2) Date: Nov. 23, 2021

(87) PCT Pub. No.: WO2021/253597
PCT Pub. Date: Dec. 23, 2021

(65) Prior Publication Data
US 2022/0321066 A1    Oct. 6, 2022

(30) Foreign Application Priority Data

Jun. 16, 2020 (CN) .......................... 202010548699.0

(51) Int. Cl.
*H03F 1/56* (2006.01)
*H03F 3/26* (2006.01)

(52) U.S. Cl.
CPC .............. *H03F 1/565* (2013.01); *H03F 3/26* (2013.01); *H03F 2200/451* (2013.01)

(58) Field of Classification Search
CPC ...... H03F 1/565; H03F 3/26; H03F 2200/451; H03F 2200/541; H03F 3/19; H03F 3/245
(Continued)

(56) References Cited

U.S. PATENT DOCUMENTS

| | | | |
|---|---|---|---|
| 2019/0013780 A1 | 1/2019 | Amiot | |
| 2019/0165754 A1 | 5/2019 | Zolomy et al. | |
| 2021/0135639 A1* | 5/2021 | Jones | H03F 1/565 |

FOREIGN PATENT DOCUMENTS

| | | |
|---|---|---|
| CN | 101577526 A | 11/2009 |
| CN | 202261179 U | 5/2012 |

(Continued)

OTHER PUBLICATIONS

Chuan Qin, Lei Zhang, Li Zhang, Yan Wang & Zhiping Yu A 5.8 GHz class-AB power amplifier with 25.4 dBm saturation power and 29.7% Pae Science China vol. 60 pp. 1-5 (Year: 2017).*

(Continued)

*Primary Examiner* — Andrea Lindgren Baltzell
*Assistant Examiner* — Jose E Pinero

(57) ABSTRACT

Provided are a PA output matching circuit, a RF front-end module and a wireless device. The circuit is used for connecting with a first PA output and a second PA output of an output stage of a push-pull PA, and comprises a load balun, a first DC blocking circuit, a second DC blocking circuit, a first feed circuit and a second feed circuit; the main coil of the load balun is provided with a first balun input and a second balun input; the first balun input is connected with the first PA output via the first DC blocking circuit, and the first balun input is connected with the first PA output via the first feed circuit; the second balun input is connected with the second PA output via the second DC blocking circuit, and the second balun input is connected with the second PA output via the second feed circuit.

17 Claims, 5 Drawing Sheets

(58) Field of Classification Search
USPC .......................................................... 330/302
See application file for complete search history.

(56) References Cited

FOREIGN PATENT DOCUMENTS

| | | |
|---|---|---|
| CN | 104953961 A | 9/2015 |
| CN | 204794909 U | 11/2015 |
| CN | 106066462 A | 11/2016 |
| CN | 106788274 A | 5/2017 |
| CN | 207490871 U | 6/2018 |
| CN | 108988793 A | 12/2018 |
| CN | 109347451 A | 2/2019 |

OTHER PUBLICATIONS

Chuan Qin et al., A 5.8 GHz class-AB power amplifier with 25.4 dBm saturation power and 29.7% Pae, Science China Information Sciences, Jan. 3, 2017, pp. 1-5, vol. 60, No. 4.
European Search Report of Counterpart European Patent Application No. 20936082.5 issued on Nov. 7, 2023.
Examination Report of Counterpart European Patent Application No. 20936082.5 issued on Nov. 17, 2023.

\* cited by examiner

PA OUTPUT MATCHING CIRCUIT, RF FRONT-END MODULE AND WIRELESS DEVICE

The present application claims the benefit of Chinese Patent Application No. 202010548699.0, filed on Jun. 16, 2020, titled "PA output matching circuit, RF front-end module and wireless device", the contents of which are incorporated herein by reference in their entirety.

TECHNICAL FIELD

The application relates to the technical field of radio frequency communication, in particular to a PA output matching circuit, a RF front-end module and a wireless device.

BACKGROUND

RF front-end is between antenna and RF transceiver, and it is the core component of electronic terminal communication. The RF front-end includes filter, LNA (Low Noise Amplifier), PA (Power Amplifier), switch and antenna tuning. PA is the core active device of RF front-end, through which electronic terminals can obtain higher RF output power. The key performance goal of the 5th-generation mobile communication technology (5G) is that the transmission rate is greatly improved compared with 4G. The new 5G technology needs to adopt the RF front-end with higher frequency, wider bandwidth and higher QAM modulation order, which makes it put forward more stringent requirements for the design of the power amplifier of the RF front-end.

Output power and power conversion efficiency (PAE, the ratio of output power to dissipated DC power) are two main performance indexes of power amplifier. For most power amplifiers, the optimal power conversion efficiency corresponds to the maximum output power, while the optimal power conversion efficiency and the maximum output power are determined by the load line of power amplifier. Generally speaking, reducing load line impedance would improve the maximum output power to a certain extent, but at the expense of power conversion efficiency. Although theoretically, load line impedance can be continuously reduced in exchange for greater output power, load line insertion loss would become worse due to the continuous reduction of load line impedance, which not only obviously deteriorates the power conversion efficiency but also leads to the maximum output power no longer becoming larger after reaching the limit value.

SUMMARY

The present application provides a PA output matching circuit, a RF front-end module and a wireless device to solve the problem that the performance of the existing power amplifier is greatly influenced by load line impedance and insertion loss.

The present application provides a PA output matching circuit, used for connecting with a first PA output and a second PA output of an output stage of a push-pull PA, and characterized by including a load balun, a first DC blocking circuit, a second DC blocking circuit, a first feed circuit and a second feed circuit; the main coil of the load balun is provided with a first balun input and a second balun input; the first balun input is connected with the first PA output via the first DC blocking circuit, and the first balun input is connected with the first PA output via the first feed circuit; the second balun input is connected with the second PA output via the second DC blocking circuit, and the second balun input is connected with the second PA output via the second feed circuit.

Preferably, the second DC blocking circuit is configured to resonate with an inductor at a working frequency band on a branch of the second DC blocking circuit between the second PA output and the second balun input;
the second DC blocking circuit is configured to resonate with an inductor at a working frequency band on a branch of the second DC blocking circuit between the second PA output and the second balun input.

Preferably, the first DC blocking circuit includes a first DC blocking capacitor; the second DC blocking circuit includes a second DC blocking capacitor.

Preferably, the first DC blocking circuit includes a first DC blocking capacitor and a first resonant inductor, and the first DC blocking capacitor and the first resonant inductor are connected in series; the second DC blocking circuit includes a second DC blocking capacitor and a second resonant inductor, and the second DC blocking capacitor and the second resonant inductor are connected in series.

Preferably, the first feed circuit is a first choke coil or an LC feed circuit; and the second feed circuit is a second choke coil or an LC feed circuit.

Preferably, the LC feed circuit includes a feed capacitor and a feed inductor, the feed capacitor and the feed inductor are connected in parallel.

Preferably, the main coil of the load balun is further provided with a power supply terminal, and the power supply terminal is connected with a ground end via a load-resonant circuit;
a first balun output and a second balun output are arranged on a secondary coil of the load balun; the first balun output is connected with a ground end via a load-resonant circuit; and the second balun output is connected with a ground end via a load-resonant circuit.

Preferably, the load-resonant circuit is a load-resonant capacitor; or
the load-resonant circuit is an LC resonant circuit, the LC resonant circuit includes an LC resonant capacitor and an LC resonant inductor, the LC resonant capacitor and the LC resonant inductor are connected in series; or
the load-resonant circuit is a π-type resonant circuit, the π-type resonant circuit includes a π-type inductor, a first π-type capacitor and a second π-type capacitor, wherein one end of the first π-type capacitor is connected with a first end of the π-type inductor, and another end is connected with a ground end; one end of the second π-type capacitor is connected with a second end of the π-type inductor, and another end is connected with a ground end.

The present application provides a RF front-end module, including a push-pull power amplification chip and a load balun arranged on a substrate, an output stage of a push-pull PA in the push-pull power amplification chip is provided with a first PA output and a second PA output, and the main coil of the load balun is provided with a first balun input and a second balun input; and the first balun input is connected with the first PA output via a first DC blocking circuit, and the first balun input is connected with the first PA output via a first feed circuit; the second balun input is connected with the second PA output via a second DC blocking circuit, and the second balun input is connected with the second PA output via a second feed circuit.

Preferably, the second DC blocking circuit is configured to resonate with an inductor at a working frequency band on a branch of the second DC blocking circuit between the second PA output and the second balun input;
the second DC blocking circuit is configured to resonate with an inductor at a working frequency band on a branch of the second DC blocking circuit between the second PA output and the second balun input.

Preferably, the first DC blocking circuit and/or the second DC blocking circuit are disposed in the push-pull power amplification chip, or the first DC blocking circuit and/or the second DC blocking circuit are disposed on the substrate.

Preferably, the first PA output and the second PA output are a collector of a bipolar junction transistor, a collector of a bipolar junction transistor array, a drain of a field-effect transistor or a drain of a field-effect transistor array.

Preferably, a load-resonant circuit is arranged between the first PA output and the second PA output, and the load-resonant circuit is a load-resonant capacitor, an LC resonant circuit or a π-type resonant circuit.

The present application provides a wireless device, including a PA output matching circuit, the PA output matching circuit is used for connecting with a first PA output and a second PA output of an output stage of a push-pull PA; wherein the PA output matching circuit includes a load balun, a first DC blocking circuit, a second DC blocking circuit, a first feed circuit and a second feed circuit; the main coil of the load balun is provided with a first balun input and a second balun input; the first balun input is connected with the first PA output via the first DC blocking circuit, and the first balun input is connected with the first PA output via the first feed circuit; the second balun input is connected with the second PA output via the second DC blocking circuit, and the second balun input is connected with the second PA output via the second feed circuit.

The application provides a wireless device, including a push-pull power amplification chip and a load balun arranged on a substrate, an output stage of a push-pull PA in the push-pull power amplification chip is provided with a first PA output and a second PA output, and the main coil of the load balun is provided with a first balun input and a second balun input; and the first balun input is connected with the first PA output via a first DC blocking circuit, and the first balun input is connected with the first PA output via a first feed circuit; the second balun input is connected with the second PA output via a second DC blocking circuit, and the second balun input is connected with the second PA output via a second feed circuit.

In the PA output matching circuit, RF front-end module and wireless device described above, a first DC blocking circuit and a first feed circuit are arranged in parallel between the first PA output of the output stage of the push-pull PA and the first balun input of the load balun to respectively transmit AC signals and DC signals; a second DC blocking circuit and a second feed circuit are arranged in parallel between the second PA output of the push-pull PA and second balun input of load balun to respectively transmit AC signals and DC signals. In this way, the influences of parasitic inductance on load line impedance and load line insertion loss can be effectively eliminated, which is helpful to ensure the output power and power conversion efficiency of the push-pull PA.

BRIEF DESCRIPTION OF DRAWINGS

In order to illustrate the technical solution of the embodiments of the application more clearly, the drawings used in the embodiments of the application will be briefly described below. Obviously, the drawings in the following description are only some examples of the present application. For those skilled in the art, other drawings can be obtained according to these drawings without creative efforts.

DETAILED DESCRIPTION

Figure 1:
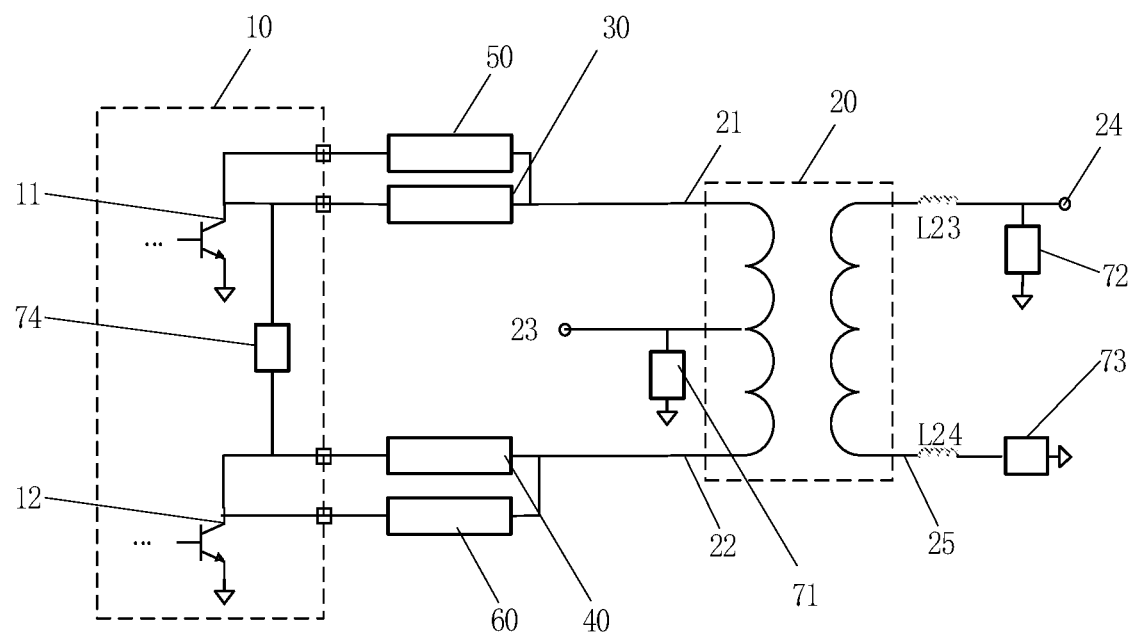
FIG. 1 is a circuit diagram of a PA output matching circuit according to an embodiment of the present application.

The technical solution of the embodiments of this application will be described clearly and completely with reference to the drawings. Obviously, the described embodiments are part of the embodiments of the present application, not all of them.

The preferred embodiments of the present disclosure are described in detail with reference to the accompanying drawings. Based on the embodiments of this application, all other embodiments obtained by those skilled in the art without creative efforts fall within the protection scope of this application.

It should be understood that the preferred embodiments described below are merely used to illustrate and explain the present disclosure, and not intended to limit the present disclosure. Rather, these embodiments are provided so that this disclosure will be thorough and complete, and will fully convey the scope of the invention to those skilled in the art. In the drawings, the dimensions and relative dimensions of layers and regions may be exaggerated for clarity, with the same reference numerals indicating the same elements throughout.

It should be understood that when an element or a layer is referred to as being "on", "adjacent to", "connected to" or "coupled to" other elements or layers, it may be directly on, adjacent to, connected to or coupled to other elements or layers, or intermediate elements or layers. In contrast, when an element is referred to as being "directly on", "directly adjacent to", "directly connected to" or "directly coupled to" other elements or layers, there is no intermediate element or layer. It should be understood that although the terms first, second, third, etc. may be used herein to describe various elements, components, regions, layers and/or sections, these elements, components, regions, layers and/or sections should not be limited by these terms. These terms are only used to distinguish the elements, components, regions, layers or parts. Thus, a first element, component, region, layer or section discussed below can be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element (s) or feature (s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Therefore, the exemplary terms "under", "below" or "underneath" may include both upper and lower orientations. The device may be otherwise oriented (rotated 90 degrees or at other orientations) and the spatially relative descriptors used herein may likewise be interpreted accordingly.

The terminology used herein is for the purpose of describing particular embodiments only and is not intended to be limiting of the application. As used herein, the singular terms "a", "an" and "the/said" include plural reference and vice versa unless the context clearly indicates otherwise. It should also be understood that the terms "comprise" and/or "include" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In order to make the present disclosure completely comprehensible, detailed steps and structures are provided in the following description. The preferred embodiments of the application are described in detail as follows, however, in addition to these detailed descriptions, there might be other embodiments.

The present application provides a PA output matching circuit, the circuit is used for connecting with a first PA output and a second PA output of an output stage of a push-pull PA, and includes a load balun, a first DC blocking circuit, a second DC blocking circuit, a first feed circuit and a second feed circuit; the main coil of load balun 20 is provided with a first balun input and a second balun input; first balun input 21 is connected with first PA output 11 via first DC blocking circuit 30, and first balun input 21 is connected with first PA output 11 via first feed circuit 50; second balun input 22 is connected with second PA output 12 via second DC blocking circuit 40, and second balun input 22 is connected with second PA output 12 via second feed circuit 60.

push-pull PA 10 is a power amplifier which adopts a push-pull structure to realize signal amplification. push-pull PA 10 may include a multi-stage power amplifier, and the output stage of push-pull PA 10 may be the final stage of the multi-stage power amplifier. There are two output ends on the output stage of push-pull PA 10, namely, first PA output 11 and second PA output 1212. The PA output matching circuit is a circuit connected with first PA output 11 and second PA output 12 of push-pull PA 10, which is used to cooperate with push-pull PA 10 to improve the output power and power conversion efficiency of RF front-end module. In this embodiment, the PA output matching circuit is connected with push-pull PA 10 via a load line, and works with push-pull PA 10 through the PA output matching circuit to improve the output power and power conversion efficiency of push-pull PA 10. In an embodiment, as shown in FIG. 1, first PA output 11 includes a first chip output end and a first VCC biasing end. The first chip output end is an output end used for transmitting RF signals, for example, the output end connected with first DC blocking circuit 30 shown in FIG. 1. The first VCC biasing end is an output end used for connecting with an external circuit, for example, the output end connected with first feed circuit 50 shown in FIG. 1. Second PA output 12 includes a second chip output end and a second VCC biasing end. The second chip output end is an output end used for transmitting RF signals, for example, the output end connected with second DC blocking circuit 40 shown in FIG. 1. The second VCC biasing end is an output end used for connecting with an external circuit, for example, the output end connected with second feed circuit 60 shown in FIG. 1.

As an embodiment, first PA output 11 and second PA output 12 are collectors of bipolar junction transistor (BJT), collectors of BJT array, drains of field-effect transistor (FET) or drains of field-effect transistor array. In this embodiment, the field-effect transistor array is an array formed by a plurality of field-effect transistors, and compared with a single field-effect transistor, the field-effect transistor array can meet the requirement of high power output of push-pull PA 10. In this embodiment, the BJT array is an array formed by a plurality of BJTs, and compared with a single BJT, the BJT array can meet the requirement of high power output of push-pull PA 10.

Load balun 20 is a balun arranged on the load line connected with push-pull PA 10, which is a three-port device, or a broadband RF transmission line transformer which realizes the connection between the balanced transmission line circuit and unbalanced transmission line circuit by converting matching input into differential output. In this embodiment, load balun 20 can be either a discrete balun or an integrated balun, which can be selected according to actual requirements.

Specifically, first balun input 21, second balun input 22 and power supply terminal 23 are arranged on the main coil of load balun 20, and first balun output 24 and second balun output 25 are arranged on the secondary coil. first balun input 21 and second balun input 22 are the input ends of load balun 20 connected to upper-level circuit (i.e. push-pull PA 10 of this embodiment). first balun output 24 and second balun output 25 are the output ends connected to lower-level circuit. power supply terminal 23 is an output end used for connecting with power supply.

Figure 2:
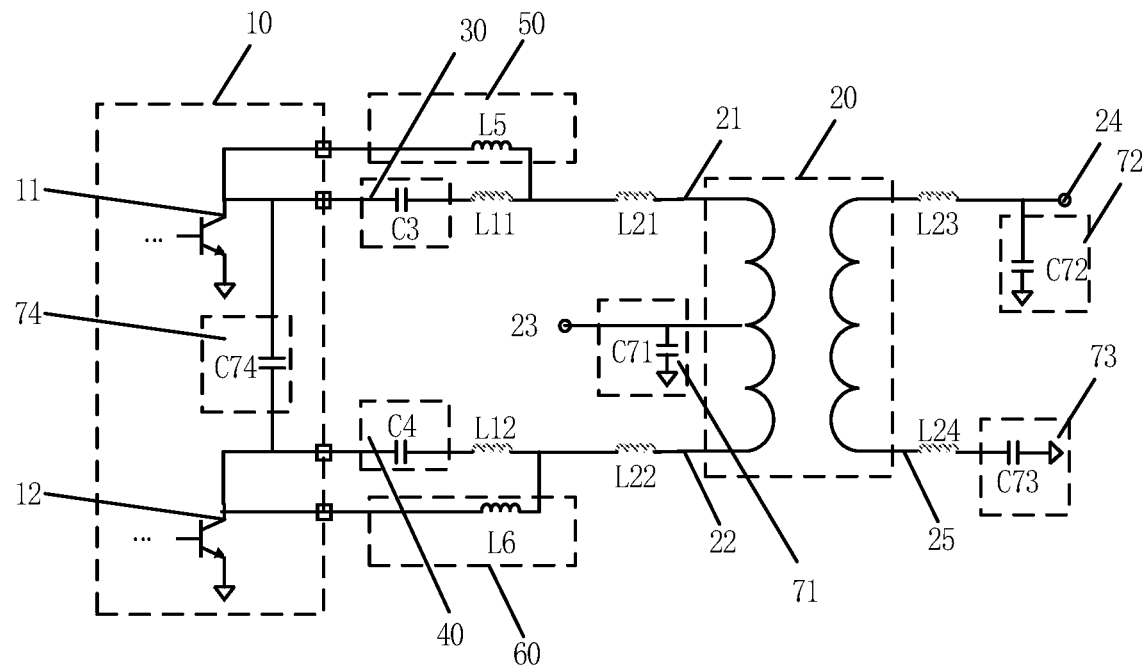
FIG. 2 is a circuit diagram of a PA output matching circuit according to an embodiment of the present application.

In this embodiment, the PA output matching circuit is connected to push-pull PA 10, specifically, first PA output 11 of push-pull PA 10 and first balun input 21 of load balun 20 are connected by a load line, and second PA output 12 of push-pull PA 10 and second balun input 22 of load balun 2020 are connected by a load line. Taking the discrete balun as an example, as shown in FIG. 2, when the PA output matching circuit works with push-pull PA 10, a first on-chip parasitic inductance L11 is formed on first PA output 11 of push-pull PA 10. A second on-chip parasitic inductance L12 is formed on second PA output 12, and these two on-chip parasitic inductance are package inductances of push-pull PA 10. Accordingly, for the main coil of load balun 20, a first balun parasitic inductance L21 is formed on its first balun input 21, a second balun parasitic inductance L22 is formed on its second balun input 22. A third balun parasitic inductance L23 is formed on first balun output 24, a fourth balun parasitic inductance L24 is formed on second balun output 25. The above four balun parasitic inductances are leakage inductances of load balun 20. Understandably, the chip-on parasitic inductance and balun parasitic inductance are not actual inductances, but the parasitic inductances between push-pull PA 10 and load balun 20, which will have a great impact on load line impedance and load line insertion loss, thus affecting the output power and power conversion efficiency of the RF front-end module formed by the cooperation of push-pull PA 10 and the PA output matching circuit.

In order to avoid the influences of parasitic inductances formed during the operation of push-pull PA 10 and load balun 20 on load line impedance and load line insertion loss, a first DC blocking circuit 30 is arranged between first PA output 11 and first balun input 21. With the DC blocking effect of first DC blocking circuit 30, AC signals are transmitted between first PA output 11 and first balun input 21 via first DC blocking circuit 30, but DC signals would not be transmitted. As the feed-back signal received by power supply terminal 23 of load balun 20 needs to be fed back to push-pull PA 10, and the feedback signal is a DC signal which cannot be transmitted via first DC blocking circuit 30, a first feed circuit 50 is required and arranged between first PA output 11 and first balun input 21. first feed circuit 50 is connected in parallel with first DC blocking circuit 30, and used for transmitting DC signals such as feedback signals to ensure the normal operation of push-pull PA 10. In this embodiment, first DC blocking circuit 30 and first feed circuit 50, which are connected in parallel between first PA output 11 and first balun input 21, are used to transmit AC signals and DC signals respectively, which can help to at least partially eliminate the influences of parasitic inductance on load line impedance and load line insertion loss, and improve the output power and power conversion efficiency of push-pull PA 10.

In order to avoid the influences of parasitic inductances formed during the operation of push-pull PA 10 and load balun 20 on load line impedance and load line insertion loss, a second DC blocking circuit 40 is arranged between second PA output 12 and second balun input 22. With the DC blocking effect of second DC blocking circuit 40, AC signals are transmitted between second PA output 12 and second balun input 22 via second DC blocking circuit 40, but DC signals would not be transmitted. As the feed-back signal received by power supply terminal 23 of load balun 20 needs to be fed back to push-pull PA 10, and the feedback signal is a DC signal which cannot be transmitted via second DC blocking circuit 40, a second feed circuit 60 is required and arranged between first PA output 12 and second balun input 22. second feed circuit 60 is connected in parallel with second DC blocking circuit 40, and used for transmitting DC signals such as feedback signals to ensure the normal operation of push-pull PA 10. In this embodiment, second DC blocking circuit 40 and second feed circuit 60, which are connected in parallel between second PA output 12 and second balun input 22, are used to transmit AC signals and DC signals respectively, which can help to at least partially eliminate the influences of parasitic inductance on load line impedance and load line insertion loss, and improve the output power and power conversion efficiency of push-pull PA 10.

In the PA output matching circuit provided by this embodiment, first DC blocking circuit 30 and first feed circuit 50 are connected in parallel between first PA output 11 of push-pull PA 10 and first balun input 21 of load balun 20 to respectively transmit AC signals and DC signals; second DC blocking circuit 40 and second feed circuit 60 are connected in parallel between second PA output 12 of push-pull PA 10 and second balun input 22 of load balun 20 to respectively transmit AC signals and DC signals. In this way, the influences of parasitic inductance on load line impedance and load line insertion loss can be effectively eliminated, which helps ensure the output power and power conversion efficiency of push-pull PA 10. As first DC blocking circuit 30, first feed circuit 50, second DC blocking circuit 40 and second feed circuit 60 cooperate with each other, the influences of parasitic inductance on load line impedance and load line insertion loss can be effectively eliminated.

In an embodiment, as shown in FIG. 2, first DC blocking circuit 30 includes a first DC blocking capacitor C3; second DC blocking circuit 40 includes a second DC blocking capacitor C4.

In this embodiment, first DC blocking capacitor C3 arranged between first PA output 11 and first balun input 21 serves as first DC blocking circuit 30. The blocking characteristic of first DC blocking capacitor C3 achieves the purpose of transmitting AC signals without transmitting DC signals, that is, AC signals from load balun 20 can reach push-pull PA 10 through the branch of first balun input 21, first DC blocking capacitor C3 and first PA output 11, but DC signals cannot reach push-pull PA 10 through this branch. Therefore, a first feed circuit 50 connected in parallel with first DC blocking capacitor C3 needs to arranged between first PA output 11 and first balun input 21 for transmitting DC signals such as feedback signals. Furthermore, first DC blocking capacitor C3 resonates with first on-chip parasitic inductance L11 and first balun parasitic inductance L21 at a specific working frequency band, thus eliminating the influences of parasitic inductance on load line impedance and load line insertion loss. Optionally, first DC blocking circuit 30 is configured to resonate with an inductor at a working frequency band on a branch of first DC blocking circuit 30 between first PA output 11 and first balun input 21; and second DC blocking circuit 40 is configured to resonate with an inductor at a working frequency band on a branch of second DC blocking circuit 40 between second PA output 12 and second balun input 22. The working frequency band is the current working frequency band of the corresponding circuit, which can be any frequency band under any communication standards, for example, N77 or N79 frequency band in 5G communication standards. Understandably, "resonate . . . at the working frequency band" may "resonate . . . at any frequencies of the working frequency band". The inductance between first PA output 11 and first balun input 21 may include physical inductance and parasitic inductance, that is, the inductance on the branch where first DC blocking circuit 30 is located. The inductance between second PA output 12 and second balun input 22 may include physical inductance and parasitic inductance, that is, the inductance on the branch where second DC blocking circuit 40 is located. Exemplarily, because there are first on-chip parasitic inductance L11 and first balun parasitic inductance L21 between first PA output 11 and first balun input 21, first DC blocking capacitor C3 may be arranged between first PA output 11 and first balun input 21. In this way, first DC blocking capacitor C3 resonates with first on-chip parasitic inductance L11 and first balun parasitic inductance L21 connected in series with first DC blocking capacitor C3 at a working frequency band, so as to better eliminate the influences of parasitic inductance on load line impedance and load line insertion loss. Therefore, first DC blocking circuit 30 does not need to be additionally provided with an inductor which can resonate with first DC blocking capacitor C3, thus simplifying the circuit and reducing the cost.

In this embodiment, second DC blocking capacitor C4 arranged between second PA output 12 and second balun input 22 serves as second DC blocking circuit 40. The blocking characteristic of second DC blocking capacitor C4 achieves the purpose of transmitting AC signals without transmitting DC signals, that is, AC signals from load balun 20 can reach push-pull PA 10 through the branch of second balun input 22, second DC blocking capacitor C4 and second PA output 12, but DC signals cannot reach push-pull PA 10 through this branch. Therefore, a second feed circuit 60 connected in parallel with second DC blocking capacitor C4 needs to arranged between second PA output 12 and second balun input 22 for transmitting DC signals such as feedback signals. Furthermore, second DC blocking capacitor C4 resonates with second on-chip parasitic inductance L12 and second balun parasitic inductance L22 at a specific working frequency band, thus eliminating the influences of parasitic inductance on load line impedance and load line insertion loss. Exemplarily, because there are second on-chip parasitic inductance L12 and second balun parasitic inductance L22 between second PA output 12 and second balun input 22, second DC blocking capacitor C4 may be arranged between second PA output 12 and second balun input 22. In this way, second DC blocking capacitor C4 resonates with second on-chip parasitic inductance L12 and second balun parasitic inductance L22 connected in series with second DC blocking capacitor C4 at a working frequency band, so as to better eliminate the influences of parasitic inductance on load line impedance and load line insertion loss. Therefore, second DC blocking circuit 40 does not need to be additionally provided with an inductor which can resonate with second DC blocking capacitor C4, thus simplifying the circuit and reducing the cost.

Specifically, the capacitance value of first DC blocking capacitor C3 is related to the inductance value and resonance frequency of first on-chip parasitic inductance L11 and first balun parasitic inductance L21. Correspondingly, the capacitance value of second DC blocking capacitor C4 is related to the inductance value and resonance frequency of second on-chip parasitic inductance L12 and second balun parasitic inductance L22. The above should satisfy $$f = \frac{1}{2\pi\sqrt{LC}},$$

where f is the resonance frequency, L is the inductance value of parasitic inductance (i.e., the equivalent inductance value of all parasitic inductances on the same branch), and C is the capacitance value of DC blocking capacitor. The resonance frequency can be set as the working frequency within the working frequency band.

Understandably, first DC blocking circuit 30 and second DC blocking circuit 40 may also be replaced by other circuits except DC blocking capacitors, as long as they can realize the DC blocking effect, or realize the DC blocking effect and resonance effect, so as to eliminate the influences of parasitic inductance on load line impedance and load line insertion loss. In this embodiment, first DC blocking capacitor C3 is used as first DC blocking circuit 30, and second DC blocking capacitor C4 is used as second DC blocking circuit 40, so that the PA output matching circuit as a whole has the advantages of simple structure, low cost and saving circuit space.

In an embodiment, first DC blocking circuit 30 includes first DC blocking capacitor C3 and a first resonant inductance, which are connected in series; second DC blocking circuit 40 includes second DC blocking capacitor C4 and a second resonant inductance, which are connected in series. In this case, first DC blocking circuit 30 is configured to make first DC blocking capacitor C3, the first resonant inductance, and the parasitic inductance on the branch resonate at a working frequency band. In this case, second DC blocking circuit 40 is configured to make second DC blocking capacitor C4, the second resonant inductance, and the parasitic inductance on the branch resonate at a working frequency band.

In an embodiment, first DC blocking circuit 30 includes a first adjustable capacitive network, and second DC blocking circuit 40 includes a second adjustable capacitive network. Specifically, when push-pull PA 10 needs to work at different working frequency bands, the capacitance values of the first adjustable capacitive network and the second adjustable capacitive network can be adjusted respectively, so that first DC blocking circuit 30 can resonate with the inductor on the branch of first DC blocking circuit 30 between first PA output 11 and first balun input 21 at different working frequency bands. And second DC blocking circuit 40 can resonate with the inductor on the branch of second DC blocking circuit 30 between second PA output 12 and second balun input 22 at different working frequency bands.

The first adjustable capacitive network may consist of more than one group of capacitors with switches, that is, each group of capacitors with switches includes switches and capacitors connected in series, or switches and capacitors connected in parallel. If each group of capacitors with switches includes switches and capacitors connected in series, then the capacitors with switches in each group are connected in parallel. If each group of capacitors with switches includes switches and capacitors connected in parallel, then the capacitors with switches in each group are connected in series.

Furthermore, the first adjustable capacitive network may be composed of a fixed capacitor circuit segment and a variable capacitor circuit segment, wherein the variable capacitor circuit segment is composed of more than one group of capacitors with switches. The fixed capacitor circuit segment includes circuits composed of fixed capacitors, wherein the fixed capacitor circuit segment and the variable capacitor circuit segment can be connected in series or in parallel with each other.

The second adjustable capacitive network may consist of more than one group of capacitors with switches, that is, each group of capacitors with switches includes switches and capacitors connected in series, or switches and capacitors connected in parallel. If each group of capacitors with switches includes switches and capacitors connected in series, then the capacitors with switches in each group are connected in parallel. If each group of capacitors with switches includes switches and capacitors connected in parallel, then the capacitors with switches in each group are connected in series.

Furthermore, the second adjustable capacitive network may be composed of a fixed capacitor circuit segment and a variable capacitor circuit segment, wherein the variable capacitor circuit segment is composed of more than one group of capacitors with switches. The fixed capacitor circuit segment includes circuits composed of fixed capacitors, wherein the fixed capacitor circuit segment and the variable capacitor circuit segment can be connected in series or in parallel with each other.

It can be understood that the above description of the first adjustable capacitive network and the second adjustable capacitive network is only an exemplary description, and the first adjustable capacitive network and the second adjustable capacitive network in the embodiment of the present application are not limited to the above structure as long as the function of the adjustable capacitance can be realized.

In an embodiment, first feed circuit 50 is a first choke coil L5 or LC feed circuit; second feed circuit 60 is a second choke coil L6 or LC feed circuit.

As shown in FIG. 2, first choke coil L5 is a choke coil arranged between first PA output 11 and first balun input 21, which mainly transmits the feedback signals of load balun 20 to push-pull PA 10, so that push-pull PA 10 can work properly according to the received feedback signals. For example, when first DC blocking circuit 30 is first DC blocking capacitor C3, some DC signals cannot be transmitted through first DC blocking capacitor C3 due to the blocking effect of first DC blocking capacitor C3. In this cases, first choke coil L5 shall be used to transmit the DC signals that cannot be transmitted by first DC blocking capacitor C3. first choke coil L5 and first DC blocking circuit 30 are connected in parallel to transmit the feedback signals, which makes the circuit have the advantages of simple structure, low cost and saving circuit space. As shown in FIG. 2, second choke coil L6 is a choke coil arranged between second PA output 12 and second balun input 22, which mainly transmits the feedback signals of load balun 20 to push-pull PA 10, so that push-pull PA 10 can work properly according to the received feedback signals. For example, when second DC blocking circuit 40 is second DC blocking capacitor C4, some DC signals cannot be transmitted through second DC blocking capacitor C4 due to the blocking effect of second DC blocking capacitor C4. In this cases, second choke coil L6 shall be used to transmit the DC signals that cannot be transmitted by second DC blocking capacitor C4. second choke coil L6 and second DC blocking circuit 40 are connected in parallel to transmit the feedback signals, which makes the circuit have the advantages of simple structure, low cost and saving circuit space.

The LC feed circuit is a circuit based on inductance and capacitance, and is used for transmitting feedback signals. In this embodiment, both first choke coil L5 and second choke coil L6 can be replaced by LC feed circuits, as long as they can realize the transmission of feedback signals when first DC blocking circuit 30 and second DC blocking circuit 40 cannot transmit the feedback signals. That is, first feed circuit 50 may be any one of first choke coil L5 and the LC feed circuit, and second feed circuit 60 may be any one of second choke coil L6 and the LC feed circuit, or any combination thereof.

In an embodiment, the LC feed circuit includes a feed capacitor and a feed inductor, the feed capacitor and the feed inductor are connected in parallel. In this embodiment, the feed capacitor and feed inductor are connected in parallel between first PA output 11 and first balun input 21, and the LC feed circuit formed by matching the feed capacitor and feed inductor is adopted to transmit feedback signals, and the circuit structure of the LC feed circuit forms an inductor capacitor tank (i.e., LC Tank), which can realize the resonance effect and help to ensure the normal operation of push-pull PA 10.

In an embodiment, the main coil of load balun 20 is further provided with a power supply terminal 23, and power supply terminal 2323 is connected with a ground end via a load-resonant circuit; a first balun output 24 and a second balun output 25 are arranged on a secondary coil of load balun 20; first balun output 24 is connected with a ground end via a load-resonant circuit; and second balun output 25 is connected with a ground end via a load-resonant circuit.

The load-resonant circuit is a circuit for providing a suitable resonant impedance.

As an embodiment, as shown in FIG. 2, the main coil of load balun 20 is further provided with a power supply terminal 23, which is connected with a ground end via a first load-resonant circuit 71. first load-resonant circuit 71 can provide suitable harmonic impedance for push-pull PA 10, so as to optimize the output power and power conversion efficiency of push-pull PA 10. first load-resonant circuit 71 is a load-resonant circuit connected to power supply terminal 23 on the main coil of load balun 20.

As an embodiment, as shown in FIG. 2, the secondary coil of load balun 20 is provided with a first balun output 24, which is connected to a ground end via a second load-resonant circuit 72, and is mainly used for eliminating the influences of impedance and insertion loss of third balun parasitic inductance L23 of the secondary coil of load balun 20, so as to optimize the output power and power conversion efficiency of push-pull PA 10. Second load-resonant circuit 72 is a load-resonant circuit connected to first balun output 24 on the secondary coil of load balun 20. In this embodiment, first balun output 24 is the output end of the entire PA output matching circuit.

As an embodiment, as shown in FIG. 2, the secondary coil of load balun 20 is provided with a second balun output 25, which is connected to a ground end via a third load-resonant circuit 73, and is mainly used for eliminating the influences of impedance and insertion loss of four balun parasitic inductance L24 of the secondary coil of load balun 20, so as to optimize the output power and power conversion efficiency of push-pull PA 10. Third load-resonant circuit 73 is a load-resonant circuit connected to second balun output 25 on the secondary coil of load balun 20.

In an embodiment, the load-resonant circuit is a load-resonant capacitor. As shown in FIG. 2, the main coil of load balun 20 is further provided with a power supply terminal 23, which is connected with a ground end via a first load-resonant circuit 71. First load-resonant circuit 71 is a first load-resonant capacitor C71, which is used to provide suitable harmonic impedance for push-pull PA 10, so as to optimize the output power and power conversion efficiency of push-pull PA 10. The secondary coil of load balun 20 is provided with a first balun output 24, which is connected to a ground end via a second load-resonant circuit 72. second load-resonant circuit 72 is a second load-resonant capacitor C72, and is mainly used for eliminating the influences of impedance and insertion loss of third balun parasitic inductance L23 of the secondary coil of load balun 20, so as to optimize the output power and power conversion efficiency of push-pull PA 10. The secondary coil of load balun 20 is provided with a second balun output 25, which is connected to a ground end via a third load-resonant circuit 73. third load-resonant circuit 73 is a third load-resonant capacitor C73, and is mainly used for eliminating the influences of impedance and insertion loss of four balun parasitic inductance L24 of the secondary coil of load balun 20, so as to optimize the output power and power conversion efficiency of push-pull PA 10.

Furthermore, when first balun output 24 is the output end of the entire PA matching circuit, if second load-resonant circuit 72 is second load-resonant capacitor C72, a tail inductor can be connected in series after second load-resonant capacitor C72 to meet the resonant suppression requirements.

In an embodiment, the load-resonant circuit is an LC resonant circuit, which includes an LC resonant capacitor and an LC resonant inductor, the LC resonant capacitor and the LC resonant inductor are connected in series. In this embodiment, the series connection of LC resonant capacitor and LC resonant inductor can play a resonance role. It can be understood that, the LC resonant circuit formed by LC resonant capacitor and LC resonant inductor in series is adopted to replace first load-resonant capacitor C71, second load-resonant capacitor C72 and third load-resonant capacitor C73 in FIG. 2, which can provide better harmonic impedance to the load line, so as to achieve the purpose of optimizing the output power and power conversion efficiency of push-pull PA 10.

In an embodiment, load-resonant circuit is a π-type resonant circuit, the π-type resonant circuit includes a π-type inductor, a first π-type capacitor and a second π-type capacitor, wherein one end of the first π-type capacitor is connected with a first end of the π-type inductor, and another end is connected with a ground end; one end of the second π-type capacitor is connected with a second end of the π-type inductor, and another end is connected with a ground end. In this embodiment, the π-type resonant circuit formed by the π-type inductor, first π-type capacitor and second π-type capacitor can also play a resonance role. It can be understood that, the π-type resonant circuit formed by π-type inductor, first π-type capacitor and second π-type capacitor is adopted to replace first load-resonant capacitor C71, second load-resonant capacitor C72 and third load-resonant capacitor C73 in FIG. 2, which can provide better harmonic impedance to the load line, so as to achieve the purpose of optimizing the output power and power conversion efficiency of push-pull PA 10.

In this embodiment, first load-resonant circuit 71, second load-resonant circuit 72, and third load-resonant circuit 73 may all be single load-resonant capacitors to provide suitable resonant impedance for push-pull PA 10. It may also be an LC resonant circuit formed by LC resonant capacitor and LC resonant inductor in series, which can provide better harmonic impedance than a single load-resonant capacitor. It may also be a π-type resonant circuit formed by π-type inductor, first π-type capacitor and second π-type capacitor, which can provide better harmonic impedance than a single fourth load-resonant capacitor C74.

An embodiment of the present application provides a RF front-end module, including a push-pull power amplification chip and a load balun arranged on a substrate, an output stage of a push-pull PA in the push-pull power amplification chip is provided with a first PA output and a second PA output, and the main coil of load balun 20 is provided with a first balun input and a second balun input; and first balun input 21 is connected with first PA output 11 via a first DC blocking circuit, and first balun input 21 is connected with first PA output 11 via a first feed circuit; second balun input 22 is connected with second PA output 12 via a second DC blocking circuit, and second balun input 22 is connected with second PA output 12 via a second feed circuit.

It can be understood that, due to the existence of parasitic inductance, when the existing RF front-end module is applied to 5G sub-6 GHz RF front-end products (including but not limited to smart phones), the voltage of power supply terminal 23 of load balun 20 needs to be raised to at least 5V (the maximum is 5.5V). Specifically, the way of adding an extra booster power management IC (Booster PMIC) has the following disadvantages: extra battery loss is brought when the power management IC works, the limited space of a cell-phone circuit board is taken up, and the design cost is increased. The PA output matching circuit or RF front-end module provided by the embodiments of this application can effectively eliminate the influences of parasitic inductance on load line impedance and load line insertion loss, so that the RF front-end module can improve the output power and power conversion efficiency of push-pull PA 10 without using an extra boost power management IC, and maintain a more competitive battery loss.

The RF front-end module provided by this embodiment includes a push-pull power amplification chip and the PA output matching circuit of the above embodiment. A first DC blocking circuit 30 and first feed circuit 50 are connected in parallel between first PA output 11 of push-pull PA 10 output stage of the push-pull power amplification chip and first balun input 21 of load balun 20 to respectively transmit AC signals and DC signals; second DC blocking circuit 40 and second feed circuit 60 are connected in parallel between second PA output 12 of push-pull PA 10 output stage of the push-pull power amplification chip and second balun input 22 of load balun 20 to respectively transmit AC signals and DC signals. In this way, the influences of parasitic inductance on load line impedance and load line insertion loss can be effectively eliminated, which helps ensure the output power and power conversion efficiency of the push-pull power amplification chip.

In an embodiment, first DC blocking circuit 30 and/or second DC blocking circuit 40 are disposed in the push-pull power amplification chip, or first DC blocking circuit 30 and/or second DC blocking circuit 40 are disposed on a substrate. That is, first DC blocking circuit 30 may be arranged in the push-pull power amplification chip or on a substrate, and the position is not limited, as long as first DC blocking circuit 30 is arranged between first PA output 11 and first balun input 21 to ensure its resonance effect can effectively eliminate the influences of parasitic inductance on load line impedance and load line insertion loss. Correspondingly, second DC blocking circuit 40 may be arranged in the push-pull power amplification chip or on a substrate, and the position is not limited, as long as second DC blocking circuit 40 is arranged between second PA output 12 and second balun input 22 to ensure its resonance effect can effectively eliminate the influences of parasitic inductance on load line impedance and load line insertion loss.

In an embodiment, the RF front-end module further includes a load-resonant circuit arranged between first PA output 11 and second PA output 12; and the load-resonant circuit is a load-resonant capacitor, an LC resonant circuit or a π-type resonant circuit. The load-resonant circuit is a circuit for providing a suitable resonant impedance.

As an embodiment, as shown in FIG. 2, the RF front-end module is provided with a fourth load-resonant circuit 74, and fourth load-resonant circuit 74 is arranged between first PA output 11 and second PA output 12, which can provide a suitable harmonic impedance for push-pull PA 10 to optimize the output power and power conversion efficiency of the push-pull power amplification chip.

For example, fourth load-resonant circuit 74 may be a fourth load-resonant capacitor C74 and provides a suitable resonant impedance for the push-pull power amplification chip. It may also be an LC resonant circuit formed by LC resonant capacitor and LC resonant inductor in series, which can provide better harmonic impedance than a single fourth load-resonant capacitor C74. It may also be a π-type resonant circuit formed by π-type inductor, first π-type capacitor and second π-type capacitor, which can provide better harmonic impedance than a single fourth load-resonant capacitor C74.

As an embodiment, first PA output 11 and second PA output 12 are collectors of bipolar junction transistor (BJT), collectors of BJT array, drains of field-effect transistor (FET) or drains of field-effect transistor array. In this embodiment, the field-effect transistor array is an array formed by a plurality of field-effect transistors, and compared with a single field-effect transistor, the field-effect transistor array can meet the requirement of high power output of push-pull PA 10. In this embodiment, the BJT array is an array formed by a plurality of BJTs, and compared with a single BJT, the BJT array can meet the requirement of high power output of push-pull PA 10.

In order to verify the effects of the RF front-end module provided by the above embodiment, simulation tests are conducted on the RF front-end module of the present application and the existing RF front-end module under the same conditions, wherein, the existing RF front-end module does not include the PA output matching circuit formed by load balun 20, first DC blocking circuit 30, second DC blocking circuit 40, first feed circuit 50 and second feed circuit 60 described in the above embodiments. The solution of simulation test for the RF front-end module provided in this embodiment was marked as Solution 1, and the solution of simulation test for the existing RF front-end module (i.e., without the above-mentioned PA output matching circuit) was marked as Solution 2. In the following, the effects of simulation tests would be discussed with reference to the drawings.

Figure 3:
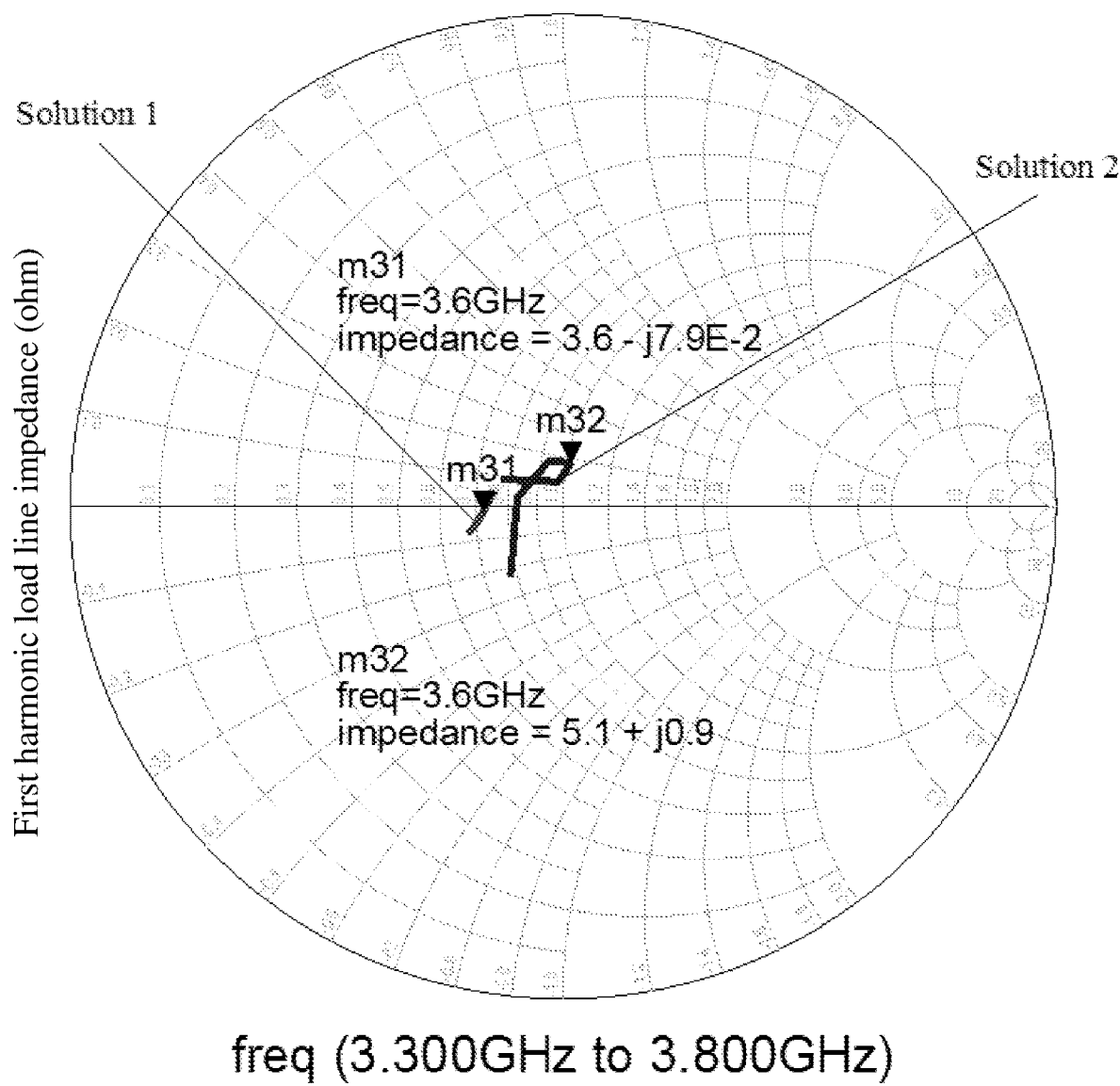
FIG. 3 is a schematic diagram of load line impedance of a simulation test conducted using N78 frequency band.

FIG. 3 shows the effect diagram of a first harmonic load line impedance simulation tests of Solution 1 and Solution 2 at N78 frequency band, that is, at N78 frequency band, the first harmonic load line impedance simulation test was conducted for the two solutions with frequency (freq) of 3.3 GHz-3.8 GHz. The results are shown with lines indicating Solution 1 and Solution 2. Two control points (m31 and m32) are selected to compare the results of load line impedances of the two solutions. That is, when the frequency (freq) is 3.6 GHz, the first harmonic load line impedance of Solution 1 is 3.6−j7.9E-2, and the first harmonic load line impedance of Solution 2 is 5.1+j0.9. It can be seen that, under the same conditions, load line impedance of Solution 1 is lower than that of Solution 2, which indicates that the PA output matching circuit provided in the embodiment can effectively eliminate the influences on load line impedance.

Figure 4:
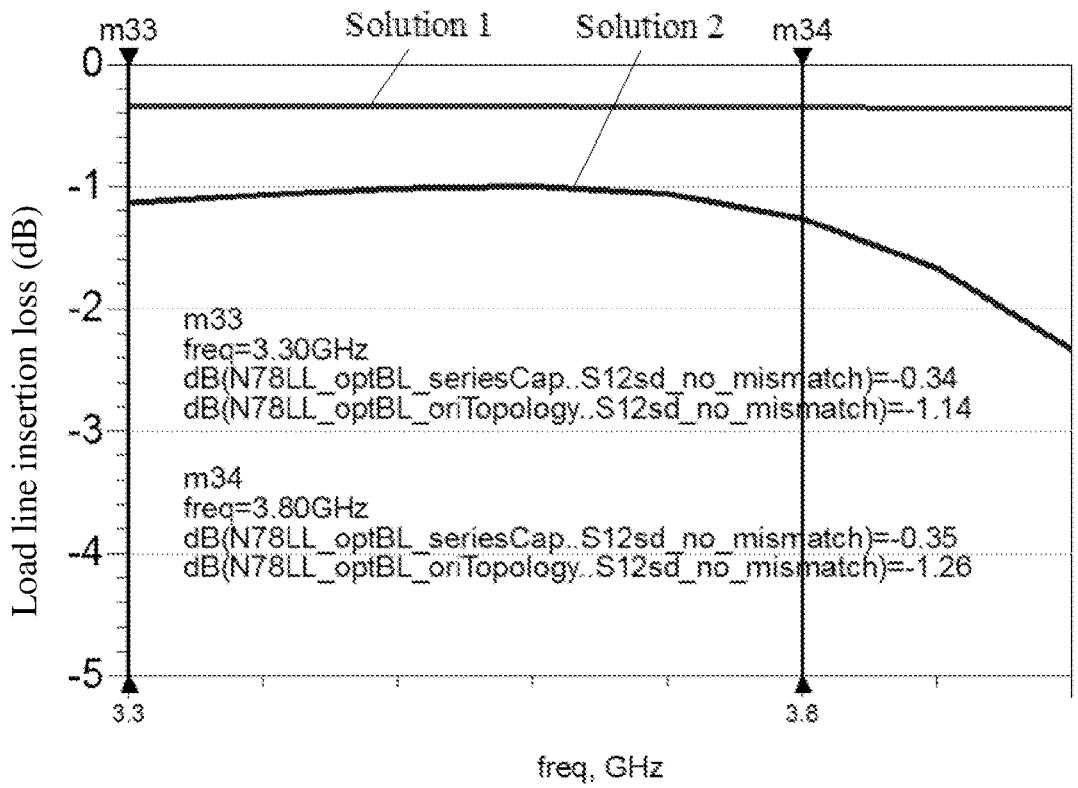
FIG. 4 is a schematic diagram of load line insertion loss of a simulation test conducted using the N78 frequency band.

FIG. 4 shows the effect diagram of load line insertion loss of simulation tests of Solution 1 and Solution 2 at N78 frequency band. In FIG. 4, two control points (m33 and m34) are selected to compare the results of load line insertion loss of the two solutions, that is, when the frequency (freq) is 3.3 GHz, load line insertion loss of Solution 1 is −0.34, and that of Solution 2 is −1.14. When the frequency (freq) is 3.8 GHz, load line insertion loss of Solution 1 is −0.35, and that of Solution 2 is −1.26. It can be seen that, under the same conditions, load line insertion loss (absolute value) of Solution 1 is lower than that of Solution 2, which indicates that the PA output matching circuit provided in the embodiment can effectively eliminate the influences on load line insertion loss.

Figure 5:
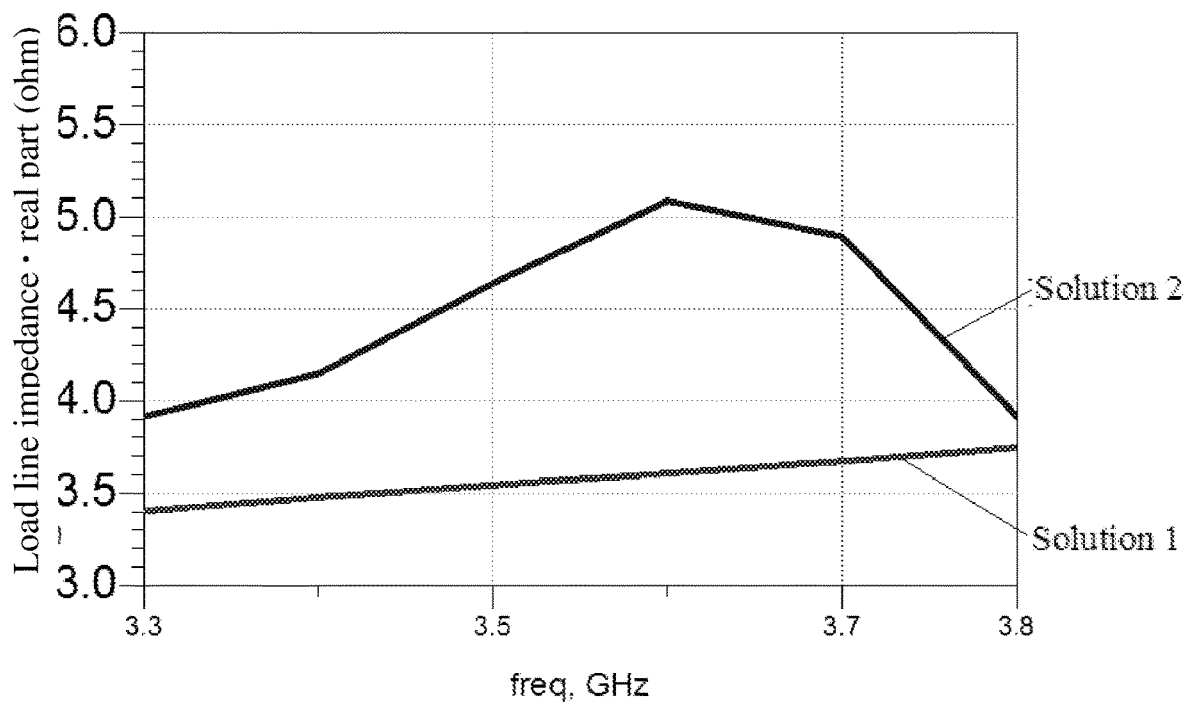
FIG. 5 is a schematic diagram of the real part of load line impedance shown in FIG. 3.
Figure 6:
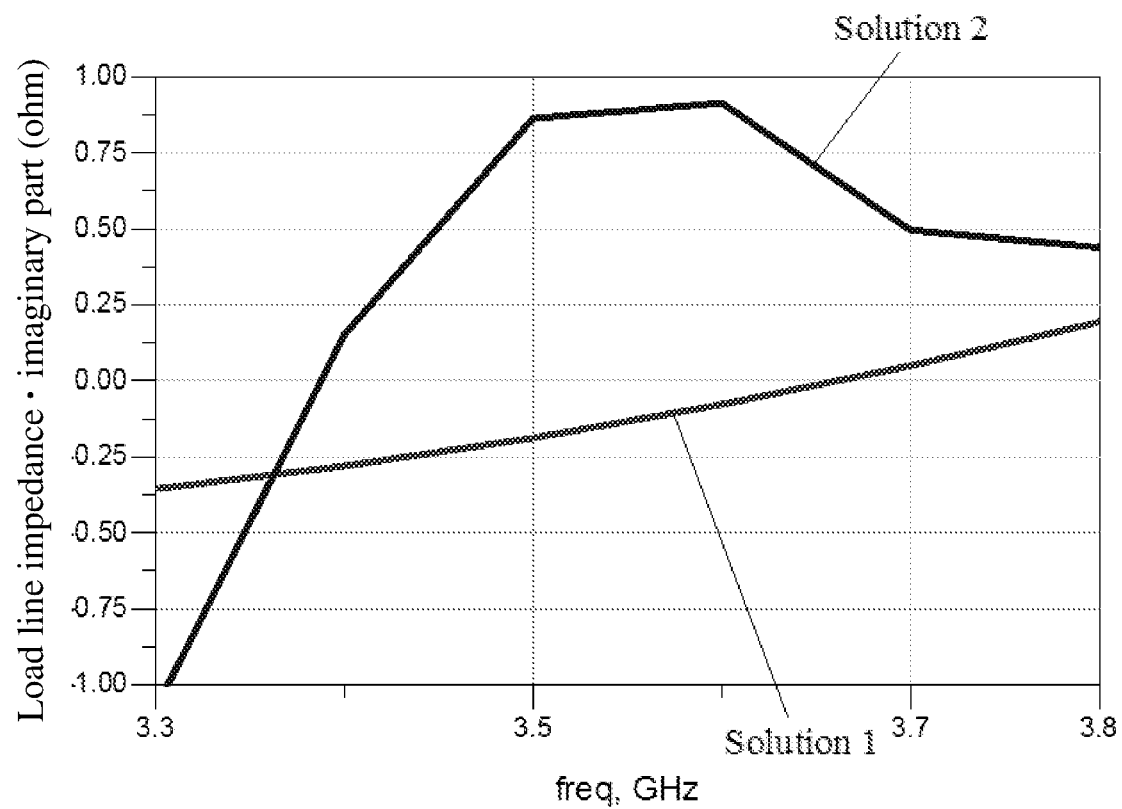
FIG. 6 is a schematic diagram of the imaginary part of load line impedance shown in FIG. 3.

FIG. 5 and FIG. 6 respectively show the real part and imaginary part of the first harmonic load line impedance in FIG. 3. It can be seen that, under the same conditions, load line impedance of Solution 1 is lower than that of Solution 2, which indicates that the PA output matching circuit provided in the embodiment can effectively eliminate the influences on load line impedance.

Figure 7:
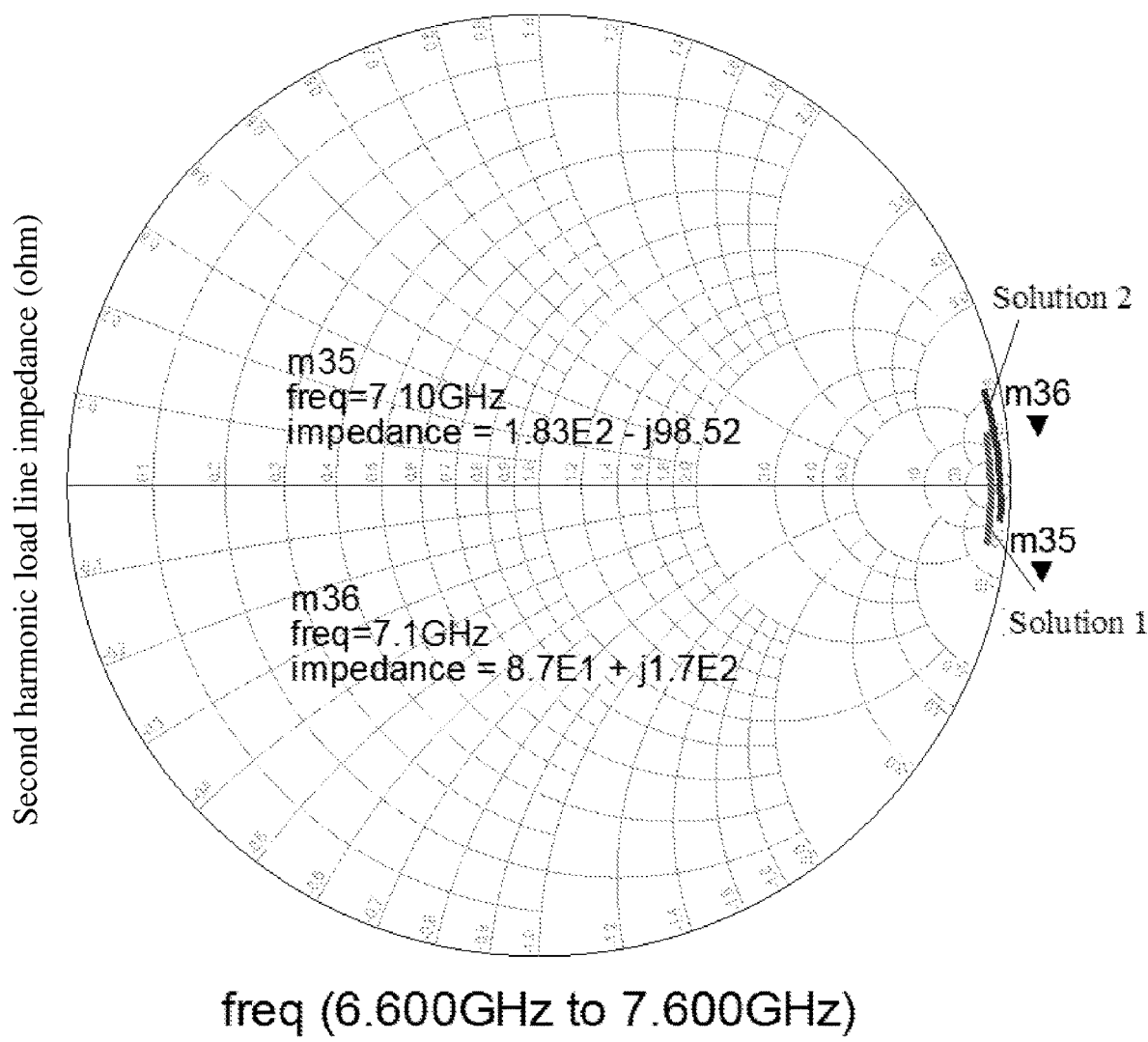
FIG. 7 is a schematic diagram of load line impedance of a secondary simulation test conducted using N78 frequency band.

FIG. 7 shows the effect diagram of a second harmonic load line impedance simulation tests of Solution 1 and Solution 2 at N78 frequency band, that is, at N78 frequency band, the second harmonic load line impedance simulation test was conducted for the two solutions with frequency (freq) of 6.6 GHz-7.6 GHz. The results are shown with lines indicating Solution 1 and Solution 2. Two control points (m35 and m36) are selected to compare load line impedances of the two solutions. That is, when the frequency (freq) is 7.1 GHz, the second harmonic load line impedance of Solution 1 is 1.83E2−j98.52, and the second harmonic load line impedance of Solution is 8.7E1+j1.7E2. It can be seen that, under the same conditions, load line impedance of Solution 1 is lower than that of Solution 2, which indicates that the PA output matching circuit provided in the embodiment can effectively eliminate the influences on load line impedance.

The embodiment of the application further provides a wireless device, including the PA output matching circuit described in the above embodiments.

The embodiment of the application further provides a wireless device, including the RF front-end module described in the above embodiments. Optionally, the RF front-end module includes a push-pull power amplification chip and the PA output matching circuit of the above embodiment. A first DC blocking circuit 30 and first feed circuit 50 are connected in parallel between first PA output 11 of push-pull PA 10 output stage of the push-pull power amplification chip and first balun input 21 of load balun 20; second DC blocking circuit 40 and second feed circuit 60 are connected in parallel between second PA output 12 of push-pull PA 10 output stage of the push-pull power amplification chip and second balun input 22 of load balun 20. In this way, the influences of parasitic inductance on load line impedance and load line insertion loss can be effectively eliminated, which helps ensure the output power and power conversion efficiency of the push-pull power amplification chip. First feed circuit 50 and second feed circuit 60 can ensure the normal transmission of feedback signals, so as to ensure the proper operation of the push-pull power amplification chip. Understandably, the wireless device includes but is not limited to mobile terminals, tablet PCs, smart watches, smart bracelets or other devices with wireless communication functions.

The above embodiments are only used to illustrate the technical solution of the present application, not intended to limit it. Although the application has been described in detail with reference to the above embodiments, those of ordinary skill in the art would understand that the technical solutions described in the above embodiments may still be modified or some of the technical features may be replaced equivalently. However, these modifications or equivalent substitutions do not deviate from the spirit or scope of the technical solutions of the embodiments of this application, and shall be included in the protection scope of this application.

What is claimed is:

1. A PA output matching circuit, used for connecting with a first PA output and a second PA output of an output stage of a push-pull PA, and characterized by comprising a load balun, a first DC blocking circuit, a second DC blocking circuit, a first feed circuit and a second feed circuit; the main coil of the load balun is provided with a first balun input and a second balun input; the first balun input is connected with the first PA output via the first DC blocking circuit, and the first balun input is connected with the first PA output via the first feed circuit; the second balun input is connected with the second PA output via the second DC blocking circuit, and the second balun input is connected with the second PA output via the second feed circuit.

2. The PA output matching circuit of claim 1, wherein the first DC blocking circuit is configured to resonate with an inductor at a working frequency band on a branch of the first DC blocking circuit between the first PA output and the first balun input; and the second DC blocking circuit is configured to resonate with an inductor at a working frequency band on a branch of the second DC blocking circuit between the second PA output and the second balun input.

3. The PA output matching circuit of claim 1, wherein the first DC blocking circuit comprises a first DC blocking capacitor, and the second DC blocking circuit comprises a second DC blocking capacitor.

4. The PA output matching circuit of claim 1, wherein the first DC blocking circuit comprises a first DC blocking capacitor and a first resonant inductor, and the first DC blocking capacitor and the first resonant inductor are connected in series; the second DC blocking circuit comprises a second DC blocking capacitor and a second resonant inductor, and the second DC blocking capacitor and the second resonant inductor are connected in series.

5. The PA output matching circuit of claim 1, wherein the first feed circuit is a first choke coil or an LC feed circuit; and the second feed circuit is a second choke coil or an LC feed circuit.

6. The PA output matching circuit of claim 5, wherein the LC feed circuit comprises a feed capacitor and a feed inductor, the feed capacitor and the feed inductor are connected in parallel.

7. The PA output matching circuit of claim 1, wherein the main coil of the load balun is further provided with a power supply terminal, and the power supply terminal is connected with a ground end via a load-resonant circuit;
a first balun output and a second balun output are arranged on a secondary coil of the load balun; the first balun output is connected with a ground end via a load-resonant circuit; and the second balun output is connected with a ground end via a load-resonant circuit.

8. The PA output matching circuit of claim 7, wherein the load-resonant circuit is a load-resonant capacitor; or
the load-resonant circuit is an LC resonant circuit, the LC resonant circuit comprises an LC resonant capacitor and an LC resonant inductor, the LC resonant capacitor and the LC resonant inductor are connected in series; or
the load-resonant circuit is a π-type resonant circuit, the π-type resonant circuit comprises a π-type inductor, a first π-type capacitor and a second π-type capacitor, wherein one end of the first π-type capacitor is connected with a first end of the π-type inductor, and another end is connected with a ground end; one end of the second π-type capacitor is connected with a second end of the π-type inductor, and another end is connected with a ground end.

9. A RF front-end module, comprising a push-pull power amplification chip and a load balun arranged on a substrate, an output stage of a push-pull PA in the push-pull power amplification chip is provided with a first PA output and a second PA output, and the main coil of the load balun is provided with a first balun input and a second balun input; and
the first balun input is connected with the first PA output via a first DC blocking circuit, and the first balun input is connected with the first PA output via a first feed circuit; the second balun input is connected with the second PA output via a second DC blocking circuit, and the second balun input is connected with the second PA output via a second feed circuit.

10. The RF front-end module of claim 9, wherein the first DC blocking circuit is configured to resonate with an inductor at a working frequency band on a branch of the first DC blocking circuit between the first PA output and the first balun input; and
the second DC blocking circuit is configured to resonate with an inductor at a working frequency band on a branch of the second DC blocking circuit between the second PA output and the second balun input.

11. The RF front-end module of claim 9, wherein the first DC blocking circuit and/or the second DC blocking circuit are disposed in the push-pull power amplification chip, or the first DC blocking circuit and/or the second DC blocking circuit are disposed on the substrate.

12. The RF front-end module of claim 9, wherein the first PA output and the second PA output are a collector of a bipolar junction transistor, a collector of a bipolar junction transistor array, a drain of a field-effect transistor or a drain of a field-effect transistor array.

13. The RF front-end module of claim 9, wherein a load-resonant circuit is arranged between the first PA output and the second PA output, and the load-resonant circuit is a load-resonant capacitor, an LC resonant circuit or a π-type resonant circuit.

14. A wireless device, comprising a PA output matching circuit, the PA output matching circuit is used for connecting with a first PA output and a second PA output of an output stage of a push-pull PA; wherein the PA output matching circuit comprises a load balun, a first DC blocking circuit, a second DC blocking circuit, a first feed circuit and a second feed circuit; the main coil of the load balun is provided with a first balun input and a second balun input; the first balun input is connected with the first PA output via the first DC blocking circuit, and the first balun input is connected with the first PA output via the first feed circuit; the second balun input is connected with the second PA output via the second DC blocking circuit, and the second balun input is connected with the second PA output via the second feed circuit.

15. The wireless device of claim 14, wherein the first DC blocking circuit is configured to resonate with an inductor at a working frequency band on a branch of the first DC blocking circuit between the first PA output and the first balun input; and
the second DC blocking circuit is configured to resonate with an inductor at a working frequency band on a branch of the second DC blocking circuit between the second PA output and the second balun input.

16. The wireless device of claim 14, wherein the first DC blocking circuit comprises a first DC blocking capacitor, or the first DC blocking circuit comprises a first DC blocking capacitor and a first resonant inductor, and the first DC blocking capacitor and the first resonant inductor are connected in series; and
the second DC blocking circuit comprises a second DC blocking capacitor, or the second DC blocking circuit comprises a second DC blocking capacitor and a second resonant inductor, and the second DC blocking capacitor and the second resonant inductor are connected in series.

17. The wireless device of claim 14, wherein the first feed circuit is a first choke coil or an LC feed circuit; the second feed circuit is a second choke coil or an LC feed circuit; the LC feed circuit comprises a feed capacitor and a feed inductor, and the feed capacitor and the feed inductor are connected in parallel.

* * * * *